US010166677B2

(12) United States Patent
Iba (10) Patent No.: US 10,166,677 B2
(45) Date of Patent: Jan. 1, 2019

(54) STATE PREDICTION SYSTEM

(71) Applicant: HONDA MOTOR CO., LTD., Tokyo (JP)

(72) Inventor: Soshi Iba, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 361 days.

(21) Appl. No.: 14/977,805

(22) Filed: Dec. 22, 2015

(65) Prior Publication Data

US 2016/0184991 A1  Jun. 30, 2016

(30) Foreign Application Priority Data

Dec. 26, 2014 (JP) ................. 2014-264272

(51) Int. Cl.
  *G06F 7/60* (2006.01)
  *G06F 17/10* (2006.01)
  *B25J 9/16* (2006.01)
  *G06F 17/50* (2006.01)

(52) U.S. Cl.
  CPC ... *B25J 9/1664* (2013.01); *G05B 2219/40521* (2013.01); *G06F 17/50* (2013.01); *Y10S 901/02* (2013.01)

(58) Field of Classification Search
  None
  See application file for complete search history.

(56) References Cited

U.S. PATENT DOCUMENTS

| 2011/0160908 A1* | 6/2011 | Iba | B25J 9/1679 |
| | | | 700/262 |
| 2011/0184555 A1* | 7/2011 | Kosuge | B25J 9/1664 |
| | | | 700/245 |
| 2013/0179382 A1* | 7/2013 | Fritsch | G06N 7/005 |
| | | | 706/46 |

FOREIGN PATENT DOCUMENTS

| JP | 2013-054703 | 3/2013 |
| JP | 2013-143134 | 7/2013 |
| JP | 2013-196601 | 9/2013 |
| JP | 5489965 | 3/2014 |

* cited by examiner

*Primary Examiner* — Cedric Johnson
(74) *Attorney, Agent, or Firm* — Rankin, Hill & Clark LLP (57) ABSTRACT

To provide a system that can enhance stability of a result of predicting the state of an object. At least one candidate trajectory having a degree of approximation to a reference trajectory generated based on a current state of the object being in a specified rank or higher over a first specification period is specified as "a first candidate trajectory". At least one candidate trajectory, extending from a last time point of being the first candidate trajectory to before elapse of a second specification period, is specified as "a second candidate trajectory". Accordingly, it becomes possible to enhance stability of the specification result of the candidate trajectory as a result of predicting the state of the object.

6 Claims, 7 Drawing Sheets

STATE PREDICTION SYSTEM

BACKGROUND OF THE INVENTION

1. Field of the Invention

The present invention relates to a technique for predicting the state of an object.

2. Description of the Related Art

When robots operate in the same environment as humans, motions of the robots need adaptive change corresponding to the movement of objects including the humans. Accordingly, methods for predicting the state of an object have been proposed (see Japanese Patent Laid-Open No. 2013-143134, Japanese Patent Laid-Open No. 2013-196601, Japanese Patent Laid-Open No. 2013-054703, and Japanese Patent No. 5489965).

However, depending on conditions of predicting the state of an object, predicted states may become unstable as they vary with high frequency, or prediction precision may become unstable.

SUMMARY OF THE INVENTION

Accordingly, an object of the present invention is to provide a system that can enhance stability of a result of predicting the state of an object.

The state prediction system of the present invention comprises: a first trajectory generation element configured to generate a reference trajectory based on a current state of an object, in accordance with a first model, the reference trajectory representing a transition mode of a probability density distribution of a future state of the object; a second trajectory generation element configured to generate a plurality of candidate trajectories based on the current state and a plurality of candidate states of the object, in accordance with a second model, the plurality of candidate trajectories each representing a transition mode of a probability density distribution from the current state to each of the plurality of candidate states of the object; and a trajectory specification element configured to evaluate a degree of approximation of each of the plurality of candidate trajectories generated by the second trajectory generation element to the reference trajectory generated by the first trajectory generation element, to specify as a first candidate trajectory a candidate trajectory having the degree of approximation being in a specified rank or higher over a first specification period, and to specify as a second candidate trajectory another candidate trajectory which is from a last time point of being the first candidate trajectory to before elapse of a second specification period.

According to the state prediction system of the present invention, at least one candidate trajectory having the degree of approximation to the reference trajectory generated based on the current state of the object being in a specified rank or higher over the first specification period is specified as "the first candidate trajectory". This makes it possible to avoid the situation where even though a probability of the state of the object transiting according to a certain candidate trajectory is only temporarily high, the candidate trajectory is specified as the first candidate trajectory. Accordingly, it becomes possible to reduce the frequency of change in the specification result as a result of predicting the state of the object.

At least one candidate trajectory, which is from a last time point of being the first candidate trajectory to before elapse of a second specification period, is specified as "a second candidate trajectory". The specification result as a result of predicting the state of the object actualizes the fact that a possibility of the state of the object transiting according to the second candidate trajectory remains. Consequently, even when the candidate trajectory specified as the second candidate trajectory is specified again as the first candidate trajectory, the situation where the prediction result of the state of the object considerably deviates from a previous prediction result may be avoided. In the state where the first candidate trajectory is not specified, the specification result as a result of predicting the state of the object actualizes the fact that a possibility of the state of the object transiting according to the second candidate trajectory is the highest, but is lower than a possibility of the state of the object transiting according to the first candidate trajectory. Consequently, even when a different candidate trajectory is specified as the first candidate thereafter, the situation where the prediction result of the state of the object considerably deviates from the previous prediction result may be avoided.

Therefore, it becomes possible to enhance stability of the specification result of the candidate trajectory as a result of predicting the state of the object.

Note that the term "object" is used to refer not only to a whole material body but also to part of the material body. The term "state" is defined by one or a plurality of parameters. The parameters include all the parameters measurable or detectable with appropriate sensors, including: dynamical parameters such as position, posture and velocity parameters of an object; physical values representing temperature, color, and luminance parameters of the object; and psychological state or physiological state parameters of animals such as humans as an object. The term "state space" is defined by Hilbert space having dimensionality of the parameters. For example, when the state of an object is a position in three-dimensional real space, the state is defined as a vector in three-dimensional state space. When the state of an object is a position and a posture in the three-dimensional real space, the state is defined as a vector in six-dimensional state space.

Assume the case where a candidate state corresponding to a candidate trajectory whose degree of approximation to the reference trajectory has been in a specified rank or higher changes before elapse of the first specification period, and a new candidate trajectory is generated in accordance with the changed candidate state. In this case, a period of time during which the new candidate trajectory is in the specified rank or higher may restart to be counted from 0. Assume the case where a candidate state corresponding to a candidate trajectory which has been specified as the second candidate trajectory changes before elapse of the second specification period, and a new candidate trajectory is generated in accordance with the changed candidate state. In this case, specification of the new candidate trajectory as the second candidate trajectory may be cancelled.

In the state prediction system of the present invention, the trajectory specification element preferably specifies as the first candidate trajectory a candidate trajectory having the degree of approximation being in a specified rank or higher over the first specification period and the degree of approximation being equal to or more than a threshold value.

According to the thus-configured state prediction system, it becomes possible to enhance not only stability but also reliability of the specification result of the candidate trajectory as a result of predicting the state of the object.

In the state prediction system of the present invention, the trajectory specification element preferably changes, in accordance with the state of the object and at least one of the plurality of candidate states, at least one of the first specification period and the second specification period, or at least one of the threshold value, the first specification period, and the second specification period.

According to the thus-configured state prediction system, it becomes possible to further enhance stability of the result of predicting the state of the object by changing factors, such as the first specification period and the second specification period, in accordance with the state of the object and the like.

In the state prediction system of the present invention, when at least one of the plurality of candidate states is in a state having an interaction between the object and another material body, the trajectory specification element preferably adopts a longer period as the first specification period or adopts a larger value as the threshold value, as the object takes a shorter time to transit to the at least one candidate state.

According to the thus-configured state prediction system, in a stage where prediction of the state of an object is important in view of causing interaction between the object and another material body, it becomes possible to enhance stability of the prediction result relative to other stages.

In the state prediction system according to the present invention, the trajectory specification element preferably evaluates stability of at least one of the state of the object and each of the plurality of candidate states, and adopts a longer period as the first specification period or adopts a larger value as the threshold value, as the stability is lower.

According to the thus-configured state prediction system, it becomes possible to enhance stability of a result of predicting the state of the object in the situation where precision of the result of predicting the state of the object may be compromised.

In the state prediction system of the present invention, the trajectory specification element preferably allocates a specified positive value as a current value of an evaluation index to the first candidate trajectory of this time, and allocates a multiplication result as a current value of the evaluation index to the candidate trajectories except the first candidate trajectory of this time, the multiplication result being obtained by multiplying a previous value of the evaluation index by a damping coefficient that is a positive value less than 1.

According to the thus-configured state prediction system, allocation of the evaluation index to each of the candidate trajectories makes it possible to enhance stability of the candidate trajectory specification result as a result of predicting the state of the object.

DETAILED DESCRIPTION OF THE PREFERRED EMBODIMENTS (Configuration)

Figure 1:
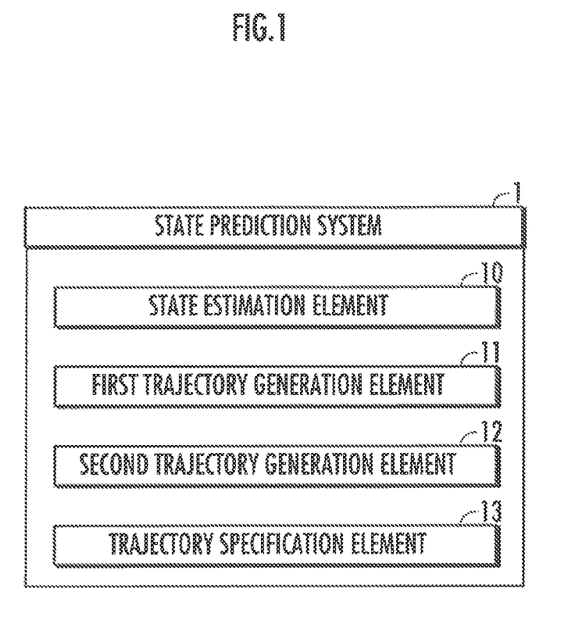
FIG. 1 is an explanatory view of a configuration of a state prediction system as one embodiment of the present invention.

A state prediction system 1 illustrated in FIG. 1 is constituted of a computer (constituted of components such as a CPU, a ROM, a RAM, and an input-output circuit). The computer may be operation-controlled by using a state prediction result and be mounted on a controlled object such as moving apparatuses. The computer may also constitute a server configured to impart command signals to the controlled object.

The state prediction system 1 comprises a state estimation element 10, a first trajectory generation element 11, a second trajectory generation element 12, and a trajectory specification element 13. The state estimation element 10 may comprise, for example, an imaging device for imaging the situation of an object. The state estimation element 10 may also comprise an interface circuit or device configured to receive a detection result of a current state of the object. The state estimation element 10 may be a constituting element of not the state prediction system 1 but an external system.

The elements 10 to 13 are each configured to execute their allocated arithmetic processes described later. The phrase that the elements are each "configured" to execute their allocated arithmetic processes signifies the following. That is, an arithmetic device such as a CPU that constitutes each of the elements is "programmed" or "designed" to read necessary information as well as a software application from a memory or a recording medium, such as ROMs and RAMs, and to execute arithmetic processes of the information based on the software application. Each of the constituting elements may be constituted of a common processor (arithmetic device), or each of the constituting elements may be constituted of a plurality of processors which can communicate with each other.

(Functions)

Figure 2:
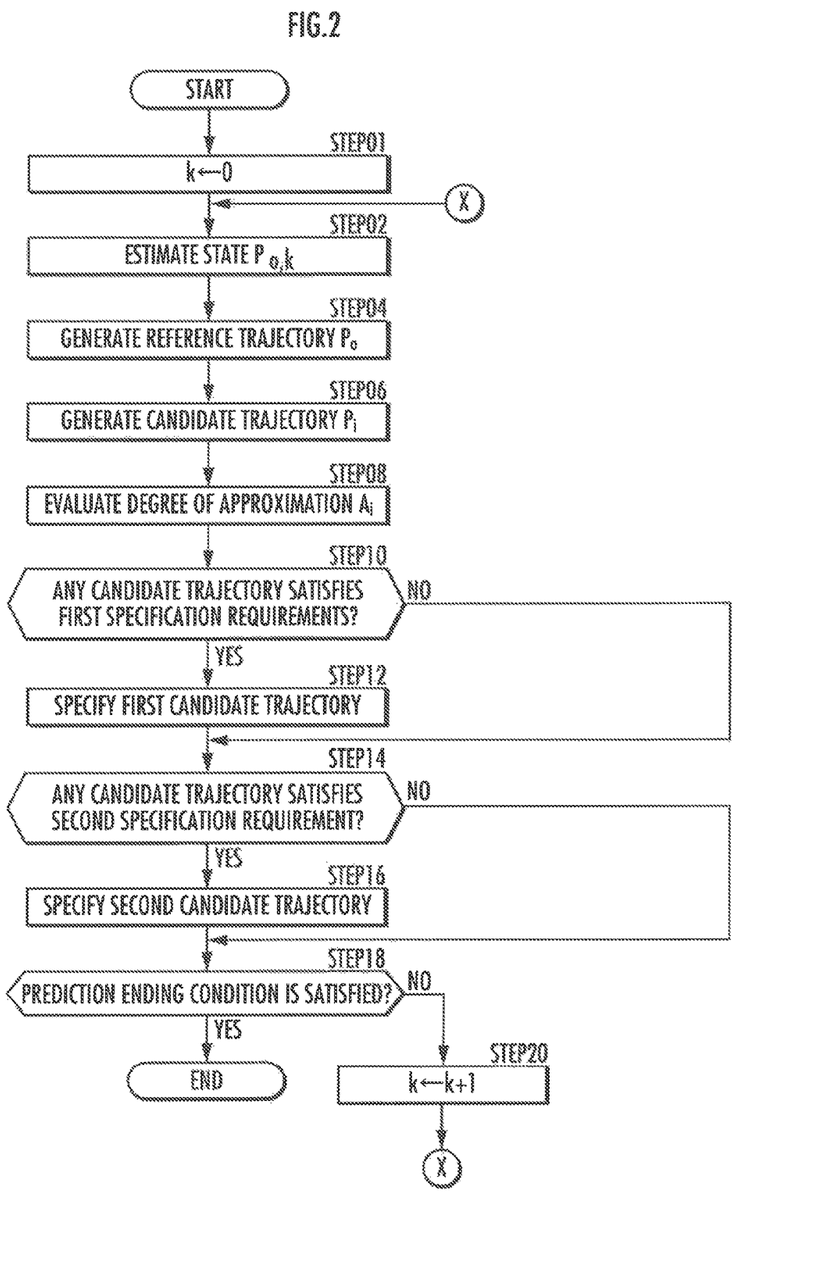
FIG. 2 is explanatory view of functions of the state prediction system as one embodiment of the present invention.

First, an index k representing discrete time that is counted at every arithmetic processing cycle $\Delta$ is reset to "0" (STEP 01 in FIG. 2).

The state estimation element 10 time-serially estimates a current state $p_{0,k}$ of an object (STEP 02 in FIG. 2). For example, a Kalman filter is used to perform the estimation, so that the current state $p_{0,k}$ is expressed by a probability density distribution (normal distribution) $N(\mu_{0,k}, \Sigma_{0,k})$.

The first trajectory generation element 11 generates a reference trajectory $P_0$ representing a transition mode of a probability density distribution of a future state of the object based on the current state $p_{0,k}$ of the object in accordance with a first model (STEP 04 in FIG. 2). As the first model, a dynamic model is adopted. In the dynamic model, a future position $p_{0,k+1}$ or the like as the state of the object is determined based on an estimated position $p_{0,k}$ in state space of the object, an estimated velocity $v_{0,k}(p_{0,k}-p_{0,k-1})/\Delta$, and an estimated acceleration $\alpha_{0,k}(v_{0,k}-v_{0,k-1})/\Delta$.

Figure 3:
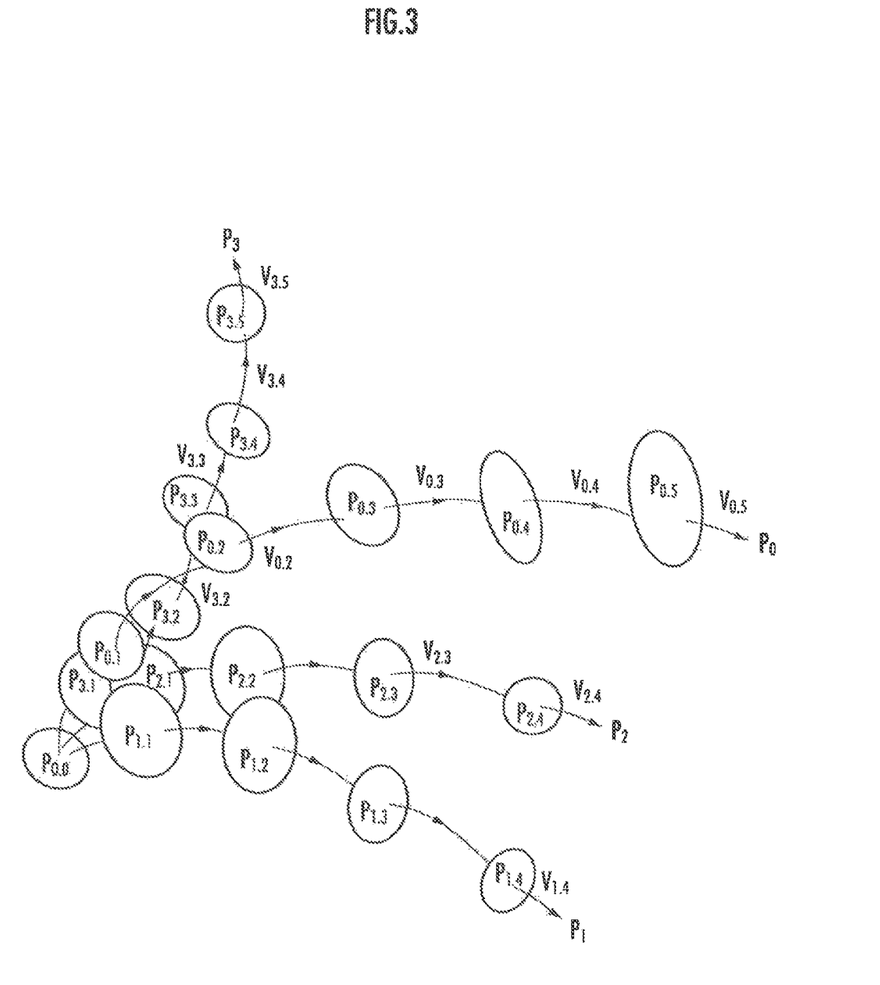
FIG. 3 is an explanatory view illustrating generation of trajectories.

As a consequence, based on the predicted position $p_{0,k+1}$ of the object in the state space as illustrated in FIG. 3, a reference trajectory $P_0$ is generated which has a spread (see an annular solid line) corresponding to a distribution $\Sigma_{0,k+1}$ of a probability density distribution (normal distribution) $N(\mu_{0,k+1}, \Sigma_{0,k+1})$. In the state space, the state $p_{0,k}$ of the object transits at a velocity $v_{0,k}$.

Based on the current state $p_{0,k}$ of the object and a plurality of candidate states $p_{i,e}$ (i=1, 2, . . . ), the second trajectory generation element 12 generates a plurality of candidate trajectories $P_i$ (or affordance trajectories) each representing a transition mode of a probability density distribution from the current state $p_{0,k}$ of the object to each of the states of the plurality of candidate states $p_{i,e}$ in accordance with a second model (STEP 06 in FIG. 2). As the second model, Hobby spline algorithm is used for example. Other spline algorithms or trajectory generation models may also be adopted as the second model.

As a consequence, based on the predicted position $p_{i,k+1}$ of the object in the state space as illustrated in FIG. 3, a reference trajectory $P_i$ is generated which has a spread (see an annular solid line) corresponding to distribution $\Sigma_{i,k+1}$ in a probability density distribution (normal distribution) $N(\mu_{i,k+1}, \Sigma_{i,k+1})$. In the state space, the state $p_{i,k}$ of the object transits at a velocity $v_{i,k}$.

The trajectory specification element 13 evaluates, for each of the plurality of candidate trajectories $P_i$ generated by the second trajectory generation element 12, a degree of approximation $A_i$ to the reference trajectory $P_0$ generated by the first trajectory generation element 11 (STEP 08 in FIG. 2).

Specifically, a reciprocal of distance $D_i$ between the reference trajectory distribution $P_0$ and each of the candidate trajectories $P_i$ is calculated as the degree of approximation $A_i$. The distance $D_i$ is an accumulative distance $D_{ik}$ between probability density distributions $p_{0k}$ and $p_{1k}$ constituting the reference trajectory distribution $P_0$ and each of the candidate trajectories $P_i$ at the same time k. The distance $D_i$ is expressed by relational expression (02):

$$D_i = D(P_0, P_i) = \Sigma_{k=1}^{min(\|0\|,\|i\|)} D_{ik},$$

$$D_{ik} = D([p_{0k}, q_{0k}],[p_{ik}, q_{ik}]) = c(q_{0k}, q_{ik}) \cdot B(p_{0k}, p_{ik}) \quad (02)$$

The coefficient $c(q_{0k}, q_{ik})$ is expressed by relational expression (04) with use of an inner product $q_{0k} \cdot q_{ik}$, where $q_{0k} = v_{0k}/|v_{ik}|$ is a unit velocity vector of a probability density distribution $p_{0k}$, and $q_{ik}$ is a unit velocity vector $q_{ik} = v_{ik}/|v_{ik}|$ of the probability density distribution in state space.

$$c(q_{0k}, q_{ik}) = 1.5 - 0.5 q_{0k} \cdot q_{ik} \quad (04)$$

For example, when both the vectors are in opposite directions, the inner product $q_{0k} \cdot q_{ik}$ equals to "−1", and therefore the coefficient $c(q_{0k}, q_{ik})$ equals to "2". When both the vectors are perpendicular to each other, the inner product $q_{0k} \cdot q_{ik}$ equals to "0", and therefore the coefficient $c(q_{0k}, q_{ik})$ equals to "1.5". When both the vectors are in an identical direction, the inner product $q_{0k} \cdot q_{ik}$ equals to "1", and therefore the coefficient $c(q_{0k}, q_{ik})$ equals to "1". More specifically, as the directions of both the vectors approximate to each other, the coefficient $c(q_{0k}, q_{ik})$ becomes smaller, and the distance $D_{ik}$ between the probability density distributions $p_{0k}$ and $p_{ik}$ becomes shorter.

As the coefficient $c(q_{0k}, q_{ik})$, a coefficient expressed by relational expression (05) may be adopted in place of relational expression (04). In relational expression (05), a wrapped normal distribution $WN(\theta_k; \mu_N, \sigma_N)$ having an average value $\mu_N$ and a standard deviation $\sigma_N$ is used.

$$c(q_{0k}, q_{ik}) = 1/WN(\theta_k; \mu_N, \sigma_N),$$

$$\theta_k = \arccos(q_{0k}, q_{ik}),$$

$$WN(\theta_k; \mu_N, \sigma_N) = \{1/(\sigma_N(2\pi)^{1/2})\} \times \Sigma_{j=-\infty}^{+\infty} \exp\{-(\theta_k - \mu_N - 2\pi j)^2/2\sigma_N^2\} = (1/2\pi)\zeta((\theta_k - \mu_N)/2\pi, i\sigma_N^2/2\pi),$$

$$\zeta(\theta, \tau) = \Sigma_{n=-\infty}^{+\infty} \exp(2ni\pi\theta) \cdot \exp(n^2 i\pi\tau) \quad (05)$$

The coefficient $B(p_{0k}, p_{ik})$ is a Bhattacharya distance between the probability density distributions $p_{0k} = N(\mu_{0k}, \Sigma_{0k})$ and $p_{ik} = N(\mu_{ik}, \Sigma_{ik})$ which are normal distributions. The Bhattacharya distance is expressed by relational expression (06):

$$B(p_{0k}, p_{ik}) = (\tfrac{1}{8})(\mu_{0k} - \mu_{ik})^T \Sigma^{-1}(\mu_{0k} - \mu_{ik}) + (\tfrac{1}{2})\ln\{\det((\Sigma_{0k} + \Sigma_{ik})/2)/(\det\Sigma_{0k} \cdot \det\Sigma_{ik})^{1/2}\} \quad (06)$$

The right-side first term of relational expression (06) indicates that the distance $B(p_{0k}, p_{ik})$ is shorter as a difference between average values $\mu_{0k}$ and $\mu_{ik}$ of both the probability density distributions is smaller. The right-side second term of relational expression (06) indicates that the distance $B(p_{ik}, p_{ik})$ varies in accordance with distributions (covariance matrixes) $\Sigma_{0k}$ and $\Sigma_{ik}$ representing spread of both the probability density distributions. As a distance between both the probability density distributions, Mahalanobis distance, KL Divergence, or convolution of two Gaussian distributions may alternatively be adopted.

Accordingly, the candidate trajectories $P_i$ may be ranked in descending order of the degree of approximation $A_i$ to the predicted position trajectory $P_0$ (in ascending order of the distance $D_i$).

The trajectory specification element 13 may determine presence or absence of any candidate trajectory, which satisfies first specification requirements, among the plurality of candidate trajectories $P_i$ (STEP 10 in FIG. 2). "The first specification requirements" include (1) the degree of approximation $A_i$ is in a specified rank or higher over the first specification period, and (2) the degree of approximation $A_i$ is equal to or more than a threshold value over the first specification period (the distance $D_i$ is within a reference distance). The first specification period represents a period of time when an index k indicative of time is updated specified number of times (for example, "twice"). The specified rank may be "second highest rank". Note that the requirement (2) may be omitted.

For example, assume that an index $j(=1, 2 \ldots)$ represents a candidate trajectory whose degree of approximation $A_i$ of this time is in an n-th rank (for example, n=1, 2), and the index j is recorded on an n-th column of a list. If a candidate trajectory $P_j$ has the index j recorded on the list consecutive number of times, including this time and past m times (for example m=2), then the candidate trajectory $P_j$ is determined to have the degree of approximation $A_i$ being in a specified rank or higher over the first specification period.

When the determination result is positive (Yes in STEP 10 in FIG. 2), at least one candidate trajectory that satisfies the first specification requirements is specified as "the first candidate trajectory" of this time (STEP 12 in FIG. 2). When the determination result is negative (No in STEP 10 in FIG. 2), no candidate trajectory is specified as the "first candidate trajectory" of this time.

The trajectory specification element 13 determines presence or absence of any candidate trajectory which satisfies a second specification requirement, among the plurality of candidate trajectories $P_i$ except the first candidate trajectory of this time (STEP 14 in FIG. 2). "The second specification requirement" is so defined that the second specification period shall not yet elapse after the last time point when the candidate trajectory is specified as the first candidate trajectory.

For example, an evaluation index $e_i$ is allocated to each of the plurality of candidate trajectories $P_i$. Satisfaction of the second specification requirement is determined based on whether or not the evaluation index $e_i$ is equal to or more than a reference value $e_0$. Specifically, a fixed positive value (for example, "1") is set as an evaluation index $e_j$ of a candidate trajectory $P_j$ specified as the first candidate trajectory of this time. An evaluation index $e_{i,k}$ of each of the candidate trajectories $P_i$ of this time is set by multiplying the evaluation index $e_{i,k-1}$ of each of the candidate trajectories $P_j$ of previous time by a damping coefficient $\gamma$ ($0<\gamma<1$ (for example, "0.99")). As a result, although the evaluation index $e_j$ is "1" at the last time point when the candidate trajectory $P_j$ is defined as the first candidate trajectory, the evaluation index $e_j$ of the candidate trajectory $P_j$ gradually becomes smaller as the damping coefficient $\gamma$ is accumulatively multiplied. When the evaluation index $e_j$ becomes smaller than the reference value $e_0$ ($=\gamma^b$), the index k is updated for a period of time equal to the integer b that satisfies an inequation of $b-1<\log_\gamma e_0 \leq b$. This period of time is equivalent to the second specification period.

When the determination result is positive (Yes in STEP 14 in FIG. 2), at least one candidate trajectory that satisfies the second specification requirement is specified as the "second candidate trajectory" of this time (STEP 16 in FIG. 2). When the determination result is negative (No in STEP 14 in FIG. 2), no candidate trajectory is specified as the "second candidate trajectory" of this time.

Next, it is determined whether or not a condition for ending the state prediction of the object is satisfied (STEP 18 in FIG. 2). The condition is, for example, that a remaining period of time until the estimated state of the object matches with any one of the plurality of candidate states becomes equal to or shorter than a specification period. If the determination result is negative (No in STEP 18 in FIG. 2), the index k is incremented by 1 (STEP 20 in FIG. 2), and then a series of processes subsequent to estimation of the state of the object are repeated (see STEPS 02 to 18 in FIG. 2). If the determination result is positive (YES in STEP 18 in FIG. 2), a series of aforementioned processes are finished.

The presence or absence of specification of the first candidate trajectory and second candidate trajectory of this time, the candidate trajectory specified as the first candidate trajectory of this time, and the candidate trajectory specified as the second candidate trajectory of this time may each may be output from the state prediction system 1 to an external system as state prediction results of the object.

Example

Figure 4:
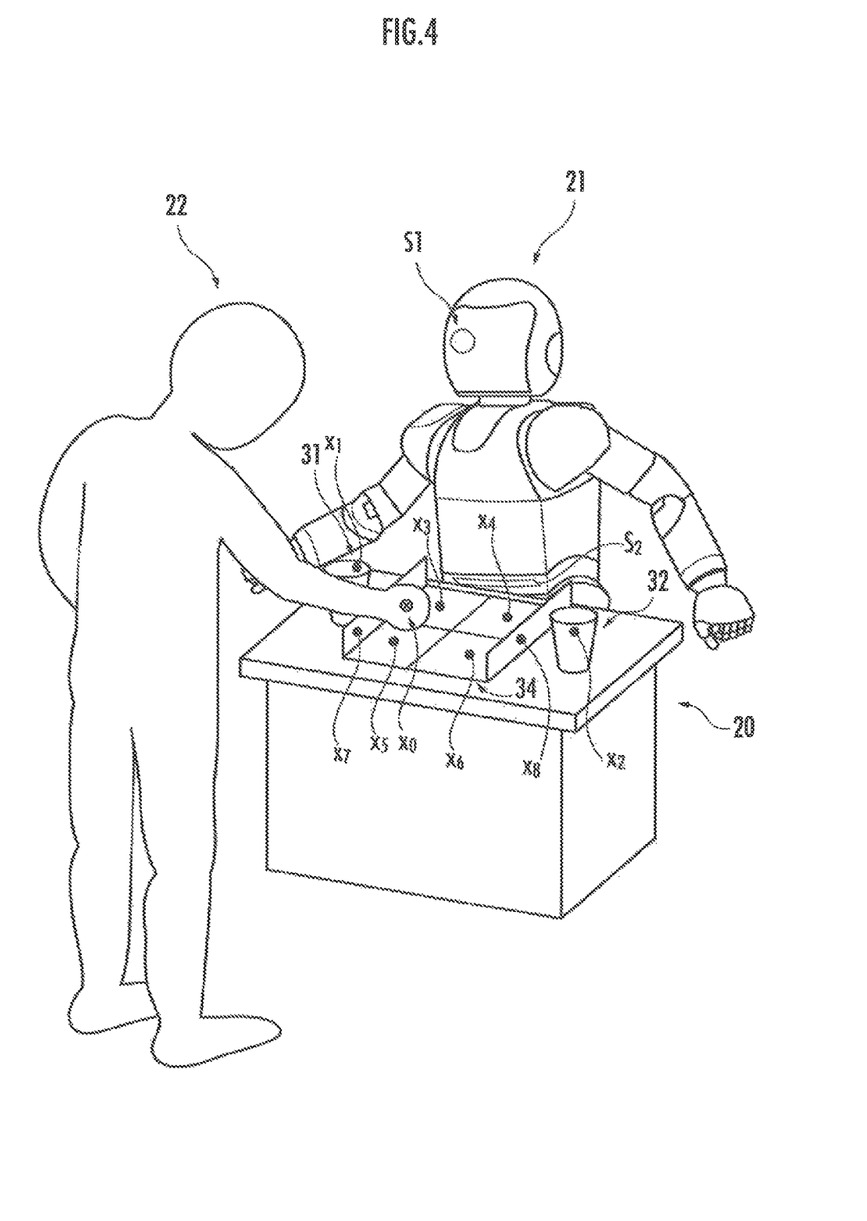
FIG. 4 is an explanatory view illustrating an example of the present invention.

A description is give of the case illustrated in FIG. 4. In FIG. 4, a humanoid robot 21 and a human 22 face each other across a table 20. In this state, the state prediction system 1 mounted on the robot 21 predicts the state of a right hand of the human 22 as an object. The robot 21 is configured as described in Japanese Patent No. 5489965 for example, and a detailed description thereof is omitted.

Laid on the table 20 are two cups 31 and 32 and one tray 34. Representative positions of eight regions are each defined as candidate positions (candidate states) $x_1$ to $x_8$. The regions include: (1) a right-side cup 31 and (2) a left-side cup 32 as viewed from the robot 21, four blocks of the tray 34 including (3) a front right-side block, (4) a front left-side block. (5) a rear right-side block, and (6) a rear left-side block, and edges of the tray 34 including (7) a right-side edge and (8) a left-side edge. The state estimation element 10 time-serially estimates a position $x_0$ of the right hand of the human 22 as the state of an object based on output signals of, for example, an image sensor $S_1$ mounted on the head of the robot 21 or an infrared sensor $S_2$ mounted on a front lower portion of a trunk of the robot 21. The state estimation element 10 also time-serially estimates each of the candidate positions $x_1$ to $x_8$ as a candidate state based on the output signals of the image sensor $S_1$ or the infrared sensor $S_2$. As the sensors for estimating each of the candidate positions $x_1$ to $x_8$ (for example, the image sensor $S_1$ or the infrared sensor $S_2$), sensors disposed outside of the robot 21 may be used.

Figure 5:
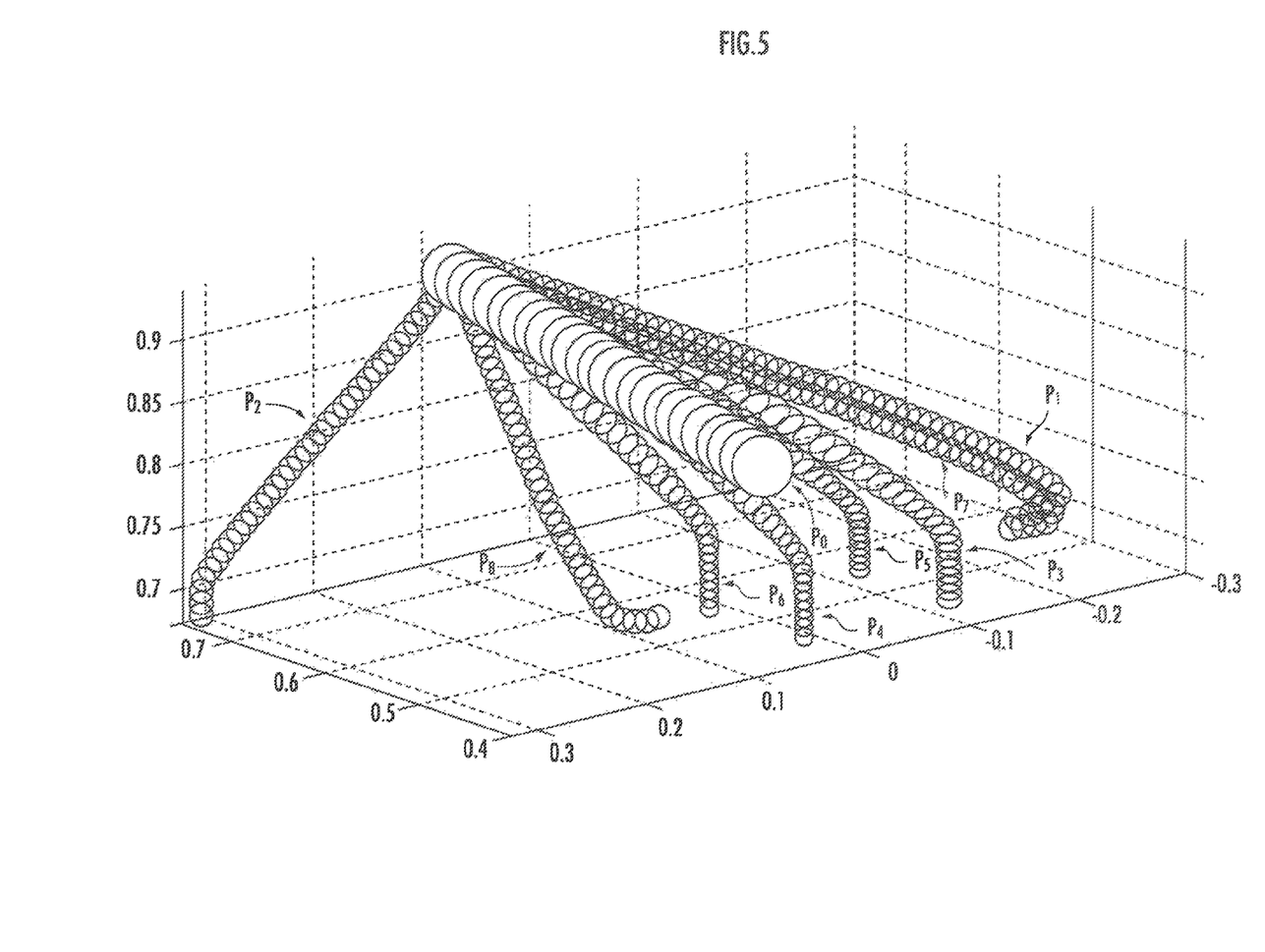
FIG. 5 is an explanatory view illustrating an example of generating a reference trajectory and candidate trajectories.

FIG. 5 illustrates a reference trajectory $P_0$ generated by the first trajectory generation element 11 based on the estimated position $x_{0,k}$ of the right hand of the human 22, and a plurality of candidate trajectories $P_1$ to $P_8$ generated by the second trajectory generation element 12 based on the estimated position $x_{0,k}$ of the right hand of the human 22 and each of the candidate positions $x_1$ to $x_8$ (see STEPS 04 and 06 in FIG. 2, and FIG. 3).

Figure 6:
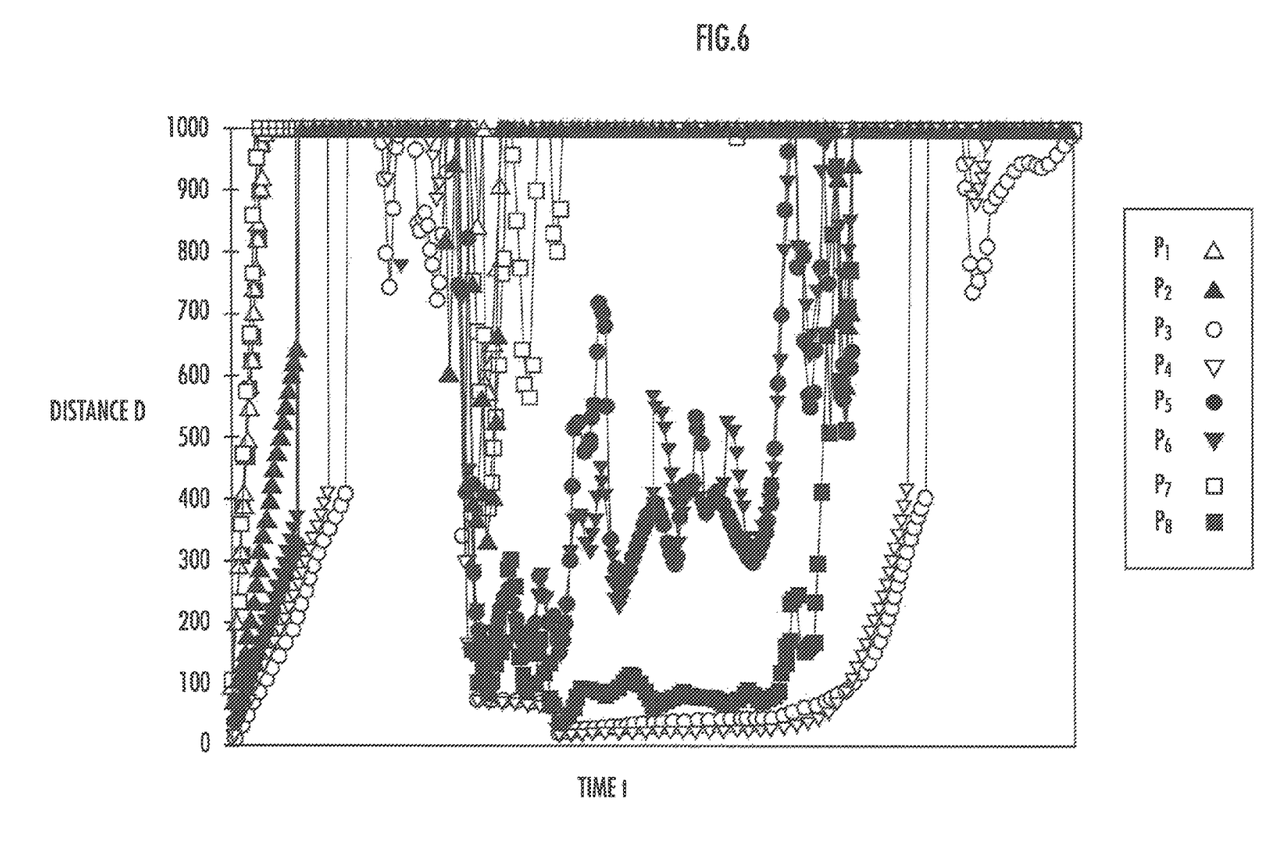
FIG. 6 is an explanatory view illustrating modes of variation in distance of each candidate trajectory with respect to the reference trajectory.
Figure 7:
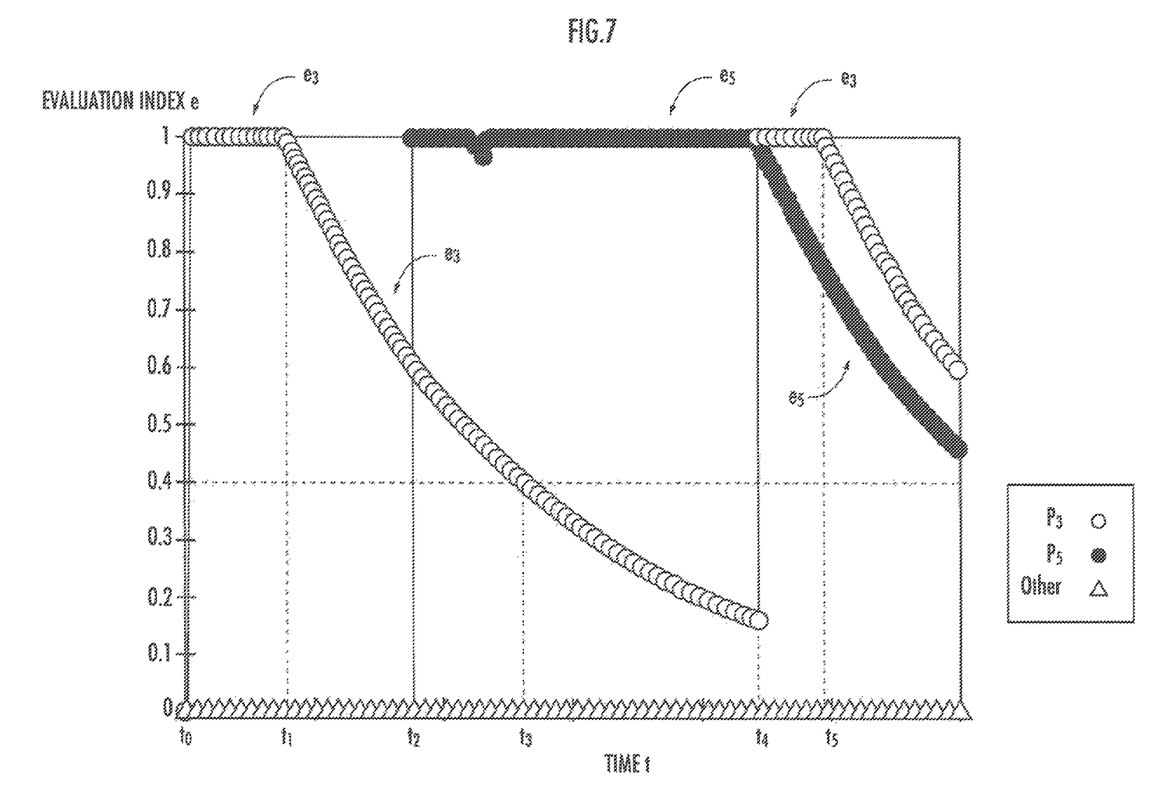
FIG. 7 is an explanatory view illustrating modes of variation in evaluation index of each candidate trajectory.

FIG. 6 illustrates time series of the distances $D_1$ to $D_8$ between the reference trajectory $P_0$ and the plurality of candidate trajectories $P_1$ to $P_8$ (see STEP 08 in FIG. 2 and relational expressions (02) to (06)). FIG. 7 illustrates time series of evaluation indices $e_1$ to $e_8$ of each of the candidate trajectories $P_1$ to $P_8$ corresponding to lengths of the distances $D_1$ to $D_8$ (or their reciprocals that are heights of the approximation degree distances $A_1$ to $A_8$).

During a time period from $t_0$ to $t_1$, an evaluation index $e_3$ of a candidate trajectory $P_3$ corresponding to a candidate position $x_3$ (position of the front right-side block of the tray 34) was "1", and so the candidate trajectory $P_3$ was specified as the "first candidate trajectory". During a time period from $t_1$ to $t_2$, the evaluation index $e_3$ of the candidate trajectory $P_3$ gradually decreased from "1" (which means that the first specified condition was not satisfied), but the second specification period had not yet elapsed (the evaluation index $e_3$ was equal to or more than the reference value $e_0$ (=0.4)). Therefore, the candidate trajectory $P_3$ was specified as the "second candidate trajectory."

At time $t_2$, an evaluation index $e_5$ of a candidate trajectory $P_5$ corresponding a candidate position $x_5$ (position of the rear right-side block of the tray 34) was "1", and so the candidate trajectory $P_5$ was specified as the first candidate trajectory. At time $t_3$, the evaluation index $e_3$ of the candidate trajectory $P_3$ became less than the reference value $e_0$ (=0.4), so that specification of the candidate trajectory $P_3$ as the second candidate trajectory was canceled. Then, at time $t_4$, the evaluation index $e_3$ of the candidate trajectory $P_3$ became "1" again, and so the candidate trajectory $P_3$ was specified as the first candidate trajectory.

During the time period from $t_2$ to $t_4$, the evaluation index $e_3$ of the candidate trajectory $P_5$ was "1", and so the candidate trajectory $P_5$ was specified as the "first candidate trajectory". After the period $t_4$, the evaluation index $e_5$ of the candidate trajectory $P_5$ gradually decreased from "1" but the second specification period had not yet elapsed. Therefore, the candidate trajectory $P_5$ was specified as the second candidate trajectory. After the period $t_5$, the evaluation index $e_3$ of the candidate trajectory $P_3$ gradually decreased from "1" but the second specification period had not yet elapsed. Therefore, the candidate trajectory $P_3$ was also specified as the second candidate trajectory in addition to the candidate trajectory $P_5$.

The transition mode of the aforementioned prediction result is summarized into Table 1.

TABLE 1

| Period | $t_0$ to $t_1$ | $t_1$ to $t_2$ | $t_2$ to $t_3$ | $t_3$ to $t_4$ | $t_4$ to $t_5$ | $t_5$ to |
|---|---|---|---|---|---|---|
| First candidate trajectory | $P_3$ | None | $P_5$ | $P_5$ | $P_3$ | None |

TABLE 1-continued

| Period | $t_0$ to $t_1$ | $t_1$ to $t_2$ | $t_2$ to $t_3$ | $t_3$ to $t_4$ | $t_4$ to $t_5$ | $t_5$ to |
|---|---|---|---|---|---|---|
| Second candidate trajectory | None | $P_3$ | $P_3$ | None | $P_5$ | $P_3$ and $P_5$ |

The control device (illustration omitted) mounted on the robot 21 successively receives results of predicting the position of the hand (object) of the human 22 (specification results of candidate trajectories (see Table 1)) output from the state prediction system 1, and controls operation of the robot 21 based on the received results.

For example, a positional attitude trajectory of the hand of the robot 21, which interferes neither the first candidate trajectory nor the second candidate trajectory, is generated, and the arm or other parts of the robot 21 is operation-controlled in accordance with the generated trajectory. The arm or other parts of the robot is operation-controlled so that the hand of the robot 21 is brought close to a candidate position corresponding to the first candidate trajectory or the second candidate trajectory. The robot 21 may be operation-controlled so as to grasp the cup 31 or 32 in response to any one of the candidate trajectories $P_3$ to $P_8$, extending toward any one of the candidate positions $x_3$ to $x_8$ on the tray 34, being specified as the first candidate trajectory. When the human 22 holds the cup 31 or 32 in the hand, the cup 31 or 32 may be set as a new object, and its future position may be predicted.

Effects

According to the state prediction system 1 described in the foregoing, at least one candidate trajectory $P_i$ having the degree of approximation $A_i$ (=1/Di) to the reference trajectory $P_0$ generated based on the current state of the object being in a specified rank or higher over the first specification period, is specified as "the first candidate trajectory" (see Yes in STEP 10→STEP12 in FIG. 2 and FIG. 7). This makes it possible to avoid the situation where a candidate trajectory is specified as the first candidate trajectory, although a probability of the state of the object transiting according to the candidate trajectory is only temporarily high. Accordingly, it becomes possible to reduce the frequency in change of the specification result as a result of predicting the state of the object. Since the first specification requirements include that the degree of approximation $A_i$ shall be equal to or more than a threshold value over the first specification period, the precision of predicting the state of the object is also enhanced.

At least one candidate trajectory, extending from a last time point of being the first candidate trajectory to before elapse of the second specification period, may be specified as the "second candidate trajectory" (see Yes in STEP 14→STEP16 in FIG. 2, and FIG. 7). The specification result as a result of predicting the state of the object actualizes the fact that a possibility of the state of the object transiting according to the second candidate trajectory remains (see the candidate trajectory $P_3$ at time $t_1$ to $t_3$ and after $t_5$ and the candidate trajectory $P_5$ after time $t_4$ in FIG. 7). Consequently, even when the candidate trajectory specified as the second candidate trajectory is specified again as the first candidate trajectory, the situation where the result of predicting the state of the object considerably deviates from a previous prediction result may be avoided (see the candidate trajectory $P_3$ at time $t_4$ in FIG. 7). In the state where the first candidate trajectory is not specified, the specification result as a result of predicting the state of the object actualizes the fact that the possibility of the state of the object transiting according to the second candidate trajectory is the highest, but is lower than the possibility of the state of the object transiting according to the first candidate trajectory (see the candidate trajectory $P_3$ at time $t_1$ to $t_3$ and after $t_5$ and the candidate trajectory $P_5$ after time $t_4$ in FIG. 7). Consequently, even when a different trajectory is specified as the first candidate trajectory thereafter, the situation where the result of predicting the state of the object considerably deviates from the previous prediction result may be avoided.

Therefore, it becomes possible to enhance stability of the specification result of the candidate trajectory as a result of predicting the state of the object.

Other Embodiments of Present Invention

The state prediction system 1 may be mounted on a vehicle. States or behaviors of objects present around the vehicle, such as other vehicles or passers-by present in the vicinity of the vehicle may be predicted, and the behavior of the vehicle may be controlled based on the prediction results so as to avoid contact with the objects. In this case, candidate states of the objects include, for example, a state of another vehicle present as an object in free space on the road or a state of an object present in an exhibition hall targeting passers-by. As described in the foregoing, the states to be predicted by the state prediction system 1 may include psychological states or physiological states of animals as an object.

The trajectory specification element 13 may change at least one of the first specification period, the second specification period, and the threshold value, in accordance with the state of an object and at least one of a plurality of candidate states. For example, when at least one of the plurality of candidate states is in a state having an interaction between the object and another material body, a longer period may be adopted as the first specification period or a larger value may be adopted as the threshold value, as the object takes a shorter time to transit to the at least one candidate state. "The state having an interaction between the object and another material body" refers to the state where, for example, the hand (object) of the human 22 is in contact with the cups 31, 32 or the tray 34 (another material body).

According to the disclosed configuration, in a stage where prediction of the state of an object is important in view of causing an interaction between the object and other entities (in a state immediately before the object interacts with other entities), stability of the prediction result relative to other stages can be enhanced.

Stability of at least one of the state of the object and each of the plurality of candidate states may be evaluated, and a longer period may be adopted as the first specification period or a larger value may be adopted as the threshold value, as the stability is lower. For example, the stability is evaluated to be lower, as the amount of variation in position of the hand of the human 22, the cups 31 and 32, or the tray 34 per unit time is larger.

According to the disclosed configuration, since relative relationship between the state of an object and candidate states makes a significant change, it becomes possible to enhance stability of the result of predicting the state of the object in the situation where precision of the result of predicting the state of the object may be compromised, such as in the case where the mode of a candidate trajectory of previous time is considerably different from the mode of a candidate trajectory of this time.

What is claimed is:

1. A state prediction system, comprising:
at least one processor; and
a memory coupled to the at least one processor, the memory storing program instructions that cause the at least one processor to execute allocated arithmetic processes as a first trajectory generation element, a second trajectory generation element, and a trajectory specification element, wherein:
the first trajectory generation element generates a reference trajectory based on a current state of an object, in accordance with a first model, the reference trajectory representing a transition mode of a probability density distribution of a future state of the object;
the second trajectory generation element generates a plurality of candidate trajectories based on the current state and a plurality of candidate states of the object, in accordance with a second model, the plurality of candidate trajectories each representing a transition mode of a probability density distribution from the current state to each of the plurality of candidate states of the object; and
the trajectory specification element evaluates a degree of approximation of each of the plurality of candidate trajectories generated by the second trajectory generation element to the reference trajectory generated by the first trajectory generation element, specifies as a first candidate trajectory, a candidate trajectory having the degree of approximation being in a specified rank or higher over a first specification period, and specifies as a second candidate trajectory, another candidate trajectory which is from a last time point of being the first candidate trajectory to before elapse of a second specification period,
wherein the trajectory specification element specifies as the first candidate trajectory, a candidate trajectory having the degree of approximation being in a specified rank or higher over the first specification period and the degree of approximation being equal to or more than a threshold value, and
wherein the at least one processor further outputs the first candidate trajectory and the second candidate trajectory to a control device of a robot, and the control device of the robot controls operation of the robot based on the first candidate trajectory and the second candidate trajectory.

2. The state prediction system according to claim 1, wherein
in accordance with at least one of the state of the object and each of the plurality of candidate states, the trajectory specification element changes at least one of the first specification period and the second specification period, or at least one of the threshold value, the first specification period, and the second specification period.

3. The state prediction system according to claim 2, wherein
when at least one of the plurality of candidate states is in a state having an interaction between the object and another material body, the trajectory specification element adopts a longer period as the first specification period or adopts a larger value as the threshold value, as the object takes a shorter time to transit to the at least one of the candidate states.

4. The state prediction system according to claim 1, wherein
the trajectory specification element evaluates stability of at least one of the current state of the object and each of the plurality of candidate states, and adopts a longer period as the first specification period or adopts a larger value as the threshold value, as the stability is lower.

5. A state prediction system, comprising:
at least one processor; and
a memory coupled to the at least one processor,
the memory storing program instructions that cause the at least one processor to execute allocated arithmetic processes as a first trajectory generation element, a second trajectory generation element, and a trajectory specification element, wherein:
the first trajectory generation element generates a reference trajectory based on a current state of an object, in accordance with a first model, the reference trajectory representing a transition mode of a probability density distribution of a future state of the object;
the second trajectory generation element generates a plurality of candidate trajectories based on the current state and a plurality of candidate states of the object, in accordance with a second model, the plurality of candidate trajectories each representing a transition mode of a probability density distribution from the current state to each of the plurality of candidate states of the object; and
the trajectory specification element evaluates a degree of approximation of each of the plurality of candidate trajectories generated by the second trajectory generation element to the reference trajectory generated by the first trajectory generation element, specifies as a first candidate trajectory, a candidate trajectory having the degree of approximation being in a specified rank or higher over a first specification period, and specifies as a second candidate trajectory, another candidate trajectory which is from a last time point of being the first candidate trajectory to before elapse of a second specification period,
wherein the trajectory specification element allocates a specified positive value as a current value of an evaluation index to the first candidate trajectory of this time, and allocates a multiplication result as a current value of the evaluation index to the candidate trajectories except the first candidate trajectory of this time, the multiplication result being obtained by multiplying a previous value of the evaluation index by a damping coefficient that is a positive value less than 1, and
wherein the at least one processor further outputs the first candidate trajectory and the second candidate trajectory to a control device of a robot, and the control device of the robot controls operation of the robot based on the first candidate trajectory and the second candidate trajectory.

6. A state prediction method executed by at least one processor according to program instructions stored in a memory coupled to the processor, the method comprising:
a first trajectory generation step for generating a reference trajectory based on a current state of an object, in accordance with a first model, the reference trajectory representing a transition mode of a probability density distribution of a future state of the object;
a second trajectory generation step for generating a plurality of candidate trajectories based on the current state and a plurality of candidate states of the object, in accordance with a second model, the plurality of candidate trajectories each representing a transition mode of a probability density distribution from the current state to each of the plurality of candidate states of the object;

a trajectory specification step for evaluating a degree of approximation of each of the plurality of candidate trajectories generated in the second trajectory generation step to the reference trajectory generated in the first trajectory generation step, for specifying as a first candidate trajectory, a candidate trajectory having the degree of approximation being in a specified rank or higher over a first specification period, and for specifying as a second candidate trajectory, another candidate trajectory which is from a last time point of being the first candidate trajectory to before elapse of a second specification period; and outputting the first candidate trajectory and the second candidate trajectory to a control device of a robot, and controlling operation of the robot based on the first candidate trajectory and the second candidate trajectory, wherein the trajectory specification step includes a step of specifying as the first candidate trajectory, a candidate trajectory having the degree of approximation being in a specified rank or higher over the first specification period and the degree of approximation being equal to or more than a threshold value.

* * * * *